United States Patent
Popp et al.

(10) Patent No.: US 7,129,155 B2
(45) Date of Patent: Oct. 31, 2006

(54) PROCESS FOR PRODUCING A PLURALITY OF GATE STACKS WHICH ARE APPROXIMATELY THE SAME HEIGHT AND EQUIDISTANT ON A SEMICONDUCTOR SUBSTRATE

(75) Inventors: Martin Popp, Dresden (DE); Andreas Wich-Glasen, Langebrück (DE)

(73) Assignee: Infineon Technologies AG, Munich (DE)

( * ) Notice: Subject to any disclaimer, the term of this patent is extended or adjusted under 35 U.S.C. 154(b) by 242 days.

(21) Appl. No.: 10/916,742

(22) Filed: Aug. 12, 2004

(65) Prior Publication Data

US 2005/0026407 A1 Feb. 3, 2005

Related U.S. Application Data

(63) Continuation of application No. PCT/EP03/02832, filed on Mar. 18, 2003.

(30) Foreign Application Priority Data

Mar. 28, 2002 (DE) .............................. 102 14 126.6

(51) Int. Cl.
H01L 21/4763 (2006.01)
(52) U.S. Cl. ..................... 438/587; 438/591; 438/595; 257/E21.507; 257/E21.592
(58) Field of Classification Search ................ 438/587, 438/588, 591, 595
See application file for complete search history.

(56) References Cited

U.S. PATENT DOCUMENTS

| 5,278,438 | A | 1/1994 | Kim et al. |
| 5,691,212 | A | 11/1997 | Tsai et al. |
| 6,143,611 | A * | 11/2000 | Gilton et al. ............... 438/279 |
| 6,162,741 | A | 12/2000 | Akasaka et al. |
| 6,187,657 | B1 | 2/2001 | Xiang et al. |
| 6,255,206 | B1 | 7/2001 | Jang et al. |
| 6,509,599 | B1 * | 1/2003 | Wurster et al. ............. 257/301 |
| 6,942,225 | B1 * | 9/2005 | Gentemann et al. ........ 277/641 |

FOREIGN PATENT DOCUMENTS

| DE | 692 24 716 T2 | 9/1998 |
| DE | 199 56 987 A1 | 5/2000 |
| DE | 100 62 494 A1 | 5/2002 |
| WO | WO 01/91180 A2 | 11/2001 |

* cited by examiner

Primary Examiner—Alexander Ghyka
(74) Attorney, Agent, or Firm—Jenkins, Wilson, Taylor & Hunt, P.A.

(57) ABSTRACT

Process for producing a plurality of gate stacks approximately the same height and equidistant on a semiconductor substrate. The process includes providing a gate dielectric on the semiconductor substrate and applying and patterning at least a first layer and a second layer, above the first layer, to the gate dielectric to produce the gate stacks. An oblique implantation of an oxidation-inhibiting implantation species is carried out into two opposite, uncovered side faces of the second of the gate stacks, with respectively adjacent gate stacks serving to shadow the uncovered side faces of the first layer of the gate stacks. Oxidation to simultaneously form a first oxide layer on uncovered side faces of the first layer of the gate stacks and a second oxide layer on uncovered side faces of the second layer of the gate stacks is carried out, the thickness of the first oxide layer being greater than the thickness of the second oxide layer.

7 Claims, 3 Drawing Sheets

PROCESS FOR PRODUCING A PLURALITY OF GATE STACKS WHICH ARE APPROXIMATELY THE SAME HEIGHT AND EQUIDISTANT ON A SEMICONDUCTOR SUBSTRATE

RELATED APPLICATIONS

This application is a continuation of PCI patent application number PCT/EP03/02832, filed Mar. 18, 2003, which claims priority to German patent application number 10214126.6, filed Mar. 28, 2002, the disclosures of each of which are incorporated herein by reference in their entirety.

TECHNICAL FIELD

The present invention relates to a process for producing a plurality of gate stacks which are approximately the same height and equidistant on a semiconductor substrate.

BACKGROUND ART

Although it can in principle be applied to any desired integrated circuits, the present invention and the problem on which it is based are explained with reference to integrated memory circuits in silicon technology.

When fabricating integrated circuits, in particular integrated semiconductor memory circuits, it is necessary to produce various types of contacts. In this context, it is desirable for these various contacts to be produced with the smallest possible number of lithography levels and etching steps, in order to ensure high alignment accuracy and low costs.

A critical contact type which makes electrical contact with the active area between two adjacent gate stacks has to be provided between the gate stacks of an integrated semiconductor memory circuits, since the spacing of the gate stacks has a critical dimension. The contact hole for the critical contact is usually etched separately from other, less critical contacts.

For a number of technology generations, the search for a suitable CB contact hole etch (SAC etch=self-aligned contact) has been a central problem. The most important requirements include:

that short circuits should not be caused between bit line and word line (CB-GC shorts), i.e. the etch should be as selective as possible with respect to the silicon nitride; and the CD dimension in the upper section of the contact hole should not be widened, since even slight widening would greatly increase the risk of CB—CB shorts via poorly aligned metalization tracks.

Hitherto, the etching process has been realized by a two-stage etch. In the first step, etching is carried out as far as possible perpendicularly and anisotropically as far as the silicon nitride cap, and in the second step, etching is carried out as far as possible selectively with respect to the silicon nitride cap, the intention being that the profile of the upper region of the contact hole KB should as far as possible not be widened.

The problem on which the present invention is based consists in the fact that during the side wall oxidation of a gate stack having, for example, a lower polysilicon layer and a metal silicide layer above it, excessive oxidation of the metal silicide layer occurs. The protrusions formed in this way mean that CB—GC short circuits may occur during the critical contact hole etch if the nitride cap is etched through and then the side wall oxide below it is removed.

SUMMARY OF THE INVENTION

According to the invention, this problem is solved by the production process given in claim 1.

The advantages of the process according to the invention reside in particular in the fact that the short-circuit problem during the contact hole etch can be alleviated by the oxide thickness decreasing in the upward direction, so that it is possible to considerably increase the process yield, for example in the DRAM production process.

The idea on which the present invention is based is to carry out an oblique oxidation-inhibiting implantation into two opposite, uncovered side faces of the second layer of the gate stacks, with in each case adjacent gate stacks being used to shadow the uncovered side faces of the first layer of the gate stacks. This makes it possible to achieve an oxide layer thickness which decreases in the upward direction during subsequent oxidation, and thereby to avoid the formation of protrusions.

The subclaims give advantageous refinements and improvements to the production process given in claim 1.

According to a preferred refinement, the oxidation is a dry oxidation. The effect of the oxide growth difference is pronounced in the case of dry oxidation. However, wet oxidation is also suitable in principle.

According to a further preferred refinement, the first layer is a polysilicon layer and the second layer is a metal silicide layer, in particular a tungsten silicide layer.

According to a further preferred refinement, to produce the gate stacks, a first layer, a second layer above the first layer and a third layer above the second layer are applied to the gate dielectric and patterned.

According to a further preferred refinement, the third layer is a silicon nitride layer.

According to a further preferred refinement, silicon nitride side wall spacers are formed over the gate stacks together with the first and second oxide layers.

According to a further preferred refinement, the implantation species is nitrogen.

An exemplary embodiment of the invention is illustrated in the drawings and explained in more detail in the following description.

DETAILED DESCRIPTION OF THE INVENTION

Figure 1A:
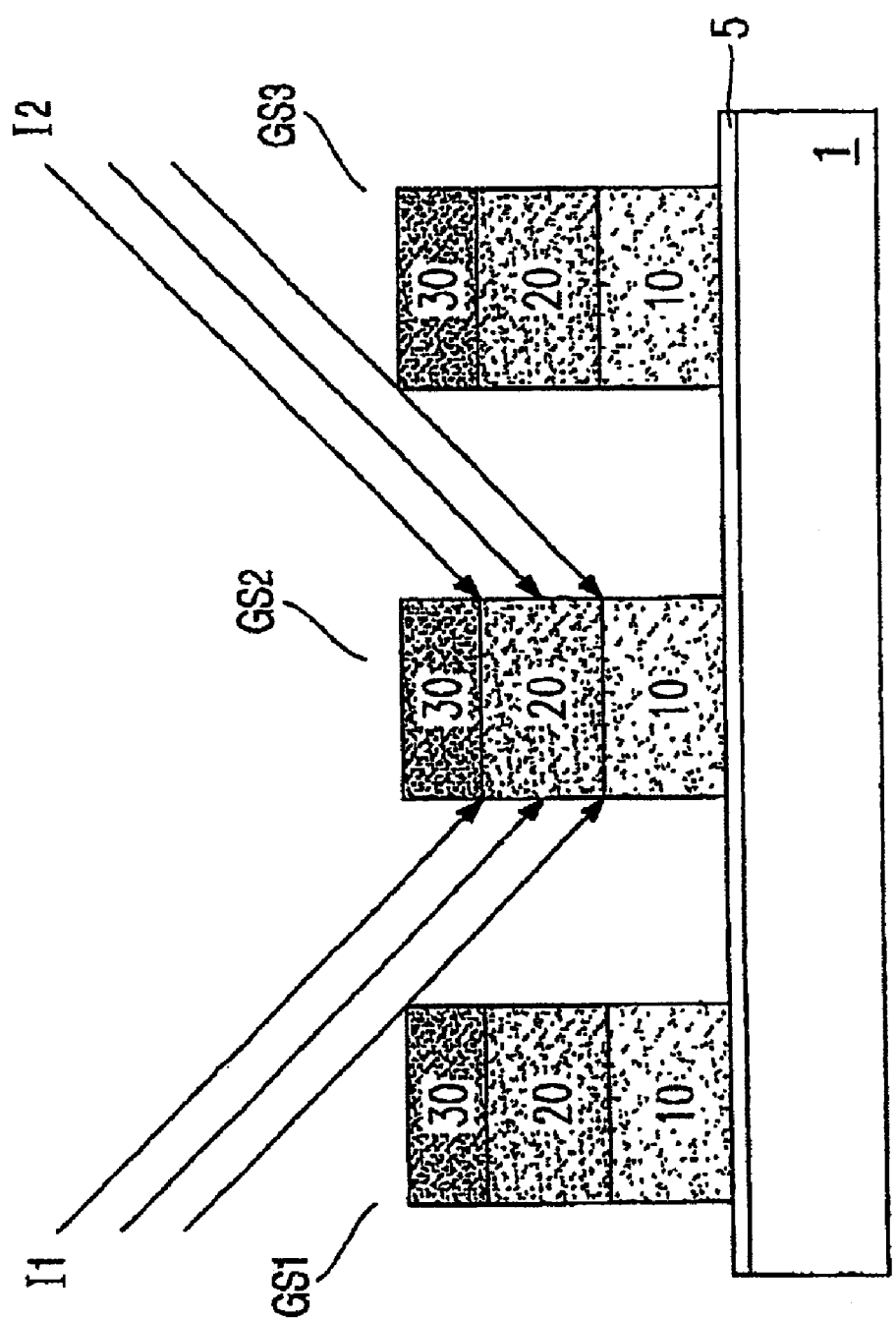
FIGS. 1a–c show diagrammatic illustrations of successive process stages of a process for producing a plurality of gate stacks which are approximately the same height and equidistant on a semiconductor substrate as an embodiment of the present invention.
Figure 1B:
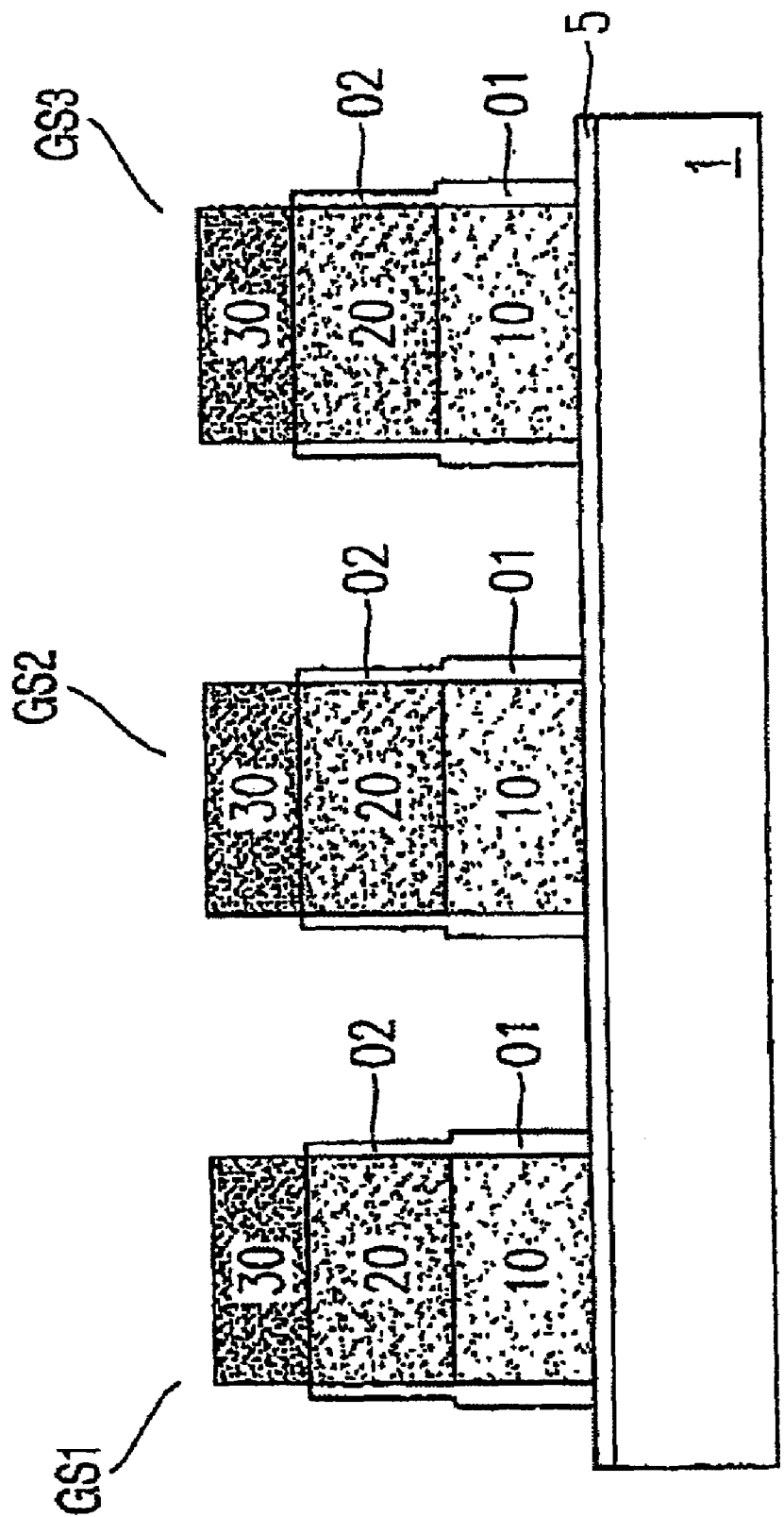
Figure 1C:
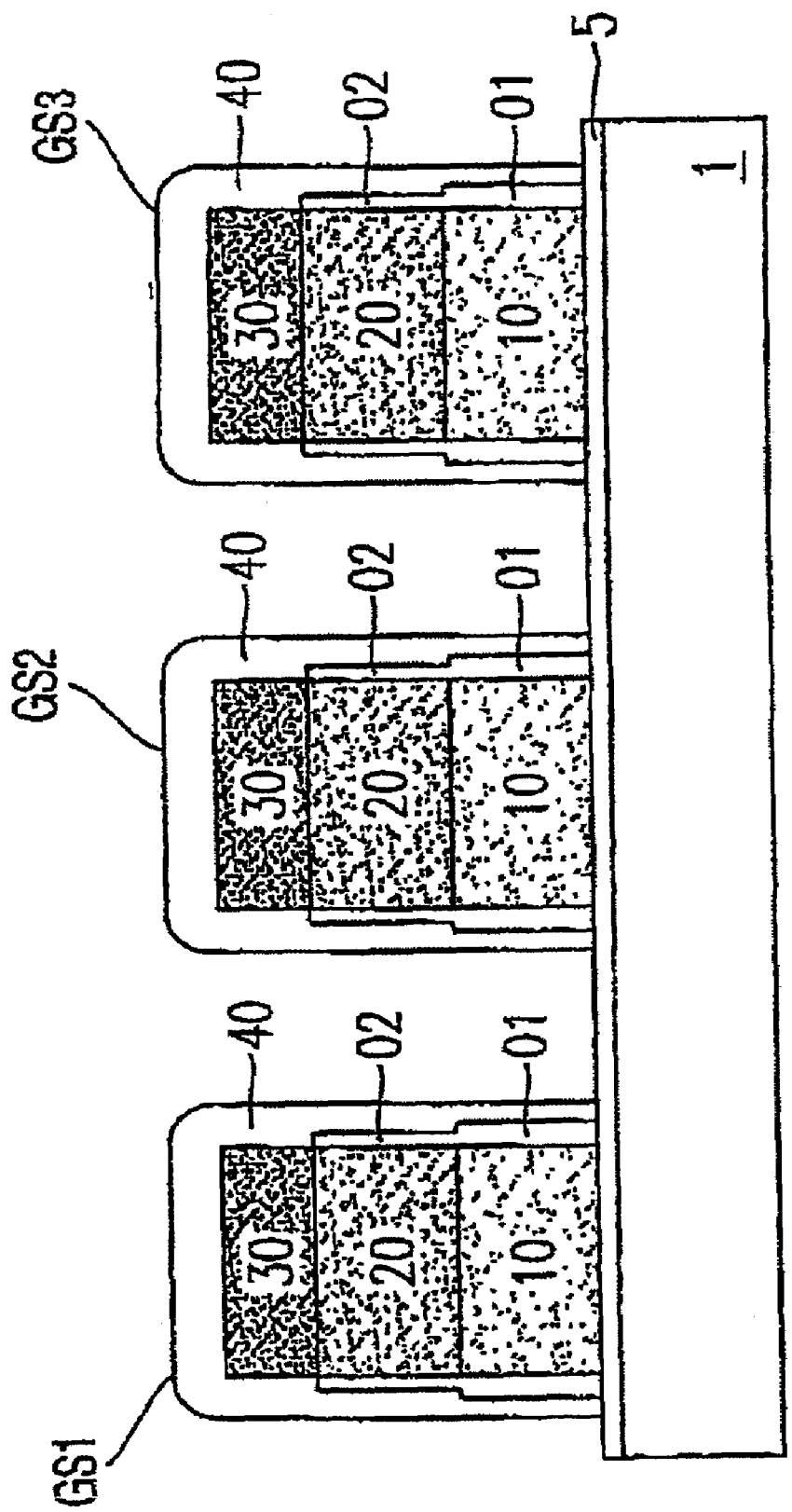

In FIGS. 1a–c, identical reference symbols denote identical or functionally equivalent parts.

In FIG. 1a, reference numeral 1 denotes a semiconductor substrate formed from silicon, to which a gate dielectric 5, for example a gate oxide, has been applied. Active areas of a memory circuit which lie under and/or between the gate stacks GS1, GS2, GS3 are not shown in the semiconductor substrate 1 in the drawing.

A polysilicon layer 10, a tungsten silicide layer 20 and a silicon nitride layer 30 are successively applied to the entire surface of this substrate 1 with the gate dielectric 5, and these layers are then patterned by means of a photolithographic etching process to form gate stacks GS1, GS2, GS3 in a manner known per se. The gate stacks are elongate formations between which are located the photolithographically etched trenches, so that in each case two opposite side wall surfaces of the gate stacks GS1, GS2, GS3 are uncovered.

In a subsequent process step, two implantations I1, I2 are carried out in order to implant nitrogen ions into the uncovered side wall surfaces of the tungsten silicide layer 20, these implantations having an oxidation-inhibiting action. In these two oblique implantations, adjacent gate stacks serve to shadow the side wall surfaces of the first layer 10 and the base region of the trenches between the gate stacks GS1, GS2, GS3.

As illustrated in FIG. 1b, a dry oxidation step is then carried out. In this dry oxidation step, oxide layers of different thicknesses are formed on the side wall surfaces of the polysilicon layer 10 and the tungsten silicide layer 20. The thickness of the oxide layer O1 on the side wall surfaces of the polysilicon layer 10 is thicker than the thickness of the oxide layer O2 on the side wall surfaces of the tungsten silicide layer 20, since the oxide growth is decelerated or delayed there on account of the prior $N_2$ implantation. This makes it possible to avoid the formation of oxide protrusions on the side wall surfaces of the tungsten silicide layer 20.

As illustrated in FIG. 1c, this is followed, in the usual way, by the provision of silicon nitride side wall spacers 40 on the gate stacks GS1, GS2, GS3.

If an etch is then carried out in a contact hole etching step (not shown), in the upper region, in which the contact hole is widened, the side wall oxide O2 is effectively protected by a silicon nitride layer 40 which is in relative terms thicker. In the lower region, where the contact hole narrows, the silicon nitride layer 40 is correspondingly thinner and the oxide layer O2 thicker, which offers reliable electrical protection for functioning.

A further advantage of the reduced oxide growth on the side walls of the tungsten silicide layer 20 consists in the fact that a lower sheet resistance can be achieved on account of the reduced consumption of tungsten silicide.

Although the present invention has been described above on the basis of a preferred exemplary embodiment, it is not restricted to this embodiment, but rather can be modified in numerous ways.

In particular, the selection of the layer materials is only an example and can be varied in numerous ways.

What is claimed is:

1. A process for producing a plurality of gate stacks which are approximately the same height and equidistant on a semiconductor substrate, comprising the steps of:
   (a) providing a gate dielectric on the semiconductor substrate;
   (b) applying and patterning at least a first layer and a second layer, above the first layer, to the gate dielectric in order to produce the gate stacks;
   (c) carrying out an oblique implantation of an oxidation-inhibiting implantation species into two opposite, uncovered side faces of the second layer of the gate stacks, with respectively adjacent gate stacks serving to shadow the uncovered side faces of the first layer of the gate stacks; and
   (d) carrying out oxidation to simultaneously form a first oxide layer on uncovered side faces of the first layer of the gate stacks and a second oxide layer on uncovered side faces of the second layer of the gate stacks, the thickness of the first oxide layer being greater than the thickness of the second oxide layer.

2. The process as claimed in claim 1, wherein the oxidation is a wet or dry oxidation.

3. The process as claimed in claim 1 wherein the first layer is a polysilicon layer and the second layer is a metal silicide layer, comprising a tungsten silicide layer.

4. The process as claimed in claim 1 wherein to produce the gate stacks, a first layer, a second layer above the first layer and a third layer above the second layer are applied to the gate dielectric and patterned.

5. The process as claimed in claim 4, wherein the third layer is a silicon nitride layer.

6. The process as claimed in claim 1, wherein silicon nitride side wall spacers are formed over the gate stacks together with the first and second oxide layers.

7. The process as claimed in claim 1, wherein the implantation species is nitrogen.

* * * * *